United States Patent [19]

Phillips et al.

[11] 4,012,766
[45] Mar. 15, 1977

[54] SEMICONDUCTOR PACKAGE AND METHOD OF MANUFACTURE THEREOF

[75] Inventors: Alvin B. Phillips, Newport Beach; Martin Monciardini; Douglas A. Mills, both of Santa Ana; Daniel Brors, Mission Viejo, all of Calif.

[73] Assignee: Western Digital Corporation, Newport Beach, Calif.

[22] Filed: Oct. 8, 1975

[21] Appl. No.: 620,572

Related U.S. Application Data

[63] Continuation of Ser. No. 392,347, Aug. 28, 1973, abandoned.

[52] U.S. Cl. .................... 357/70; 357/72; 174/52 FP; 29/588; 29/591
[51] Int. Cl.² ............ H01L 23/48; H01L 23/28; H02G 13/08; B01J 17/00
[58] Field of Search ........... 357/70, 72; 174/52 FP; 29/588, 591

[56] References Cited

UNITED STATES PATENTS

| | | | |
|---|---|---|---|
| 3,509,430 | 4/1970 | Mroz | 357/70 |
| 3,689,683 | 9/1972 | Paletto | 357/70 |

*Primary Examiner*—Edward J. Wojciechowicz
*Attorney, Agent, or Firm*—Spensley, Horn and Lubitz

[57] ABSTRACT

An improved plastic package and method of manufacture thereof for use in packaging integrated circuit semiconductor devices and the like. A transfer molded package having the lead frame disposed therein is formed having an opening therethrough. The device to be packaged is mounted on a stepped mounting member which then is located with respect to the opening with the height of the step being selected to generally dispose the top surface of the device substantially co-planar with the adjacent leads of the package. Sealing of the package may be accomplished by potting the upper and lower cavities of the opening in the plastic package, or by potting or cementing over a cup above the device so the space immediately above the device remains unfilled after sealing.

13 Claims, 7 Drawing Figures

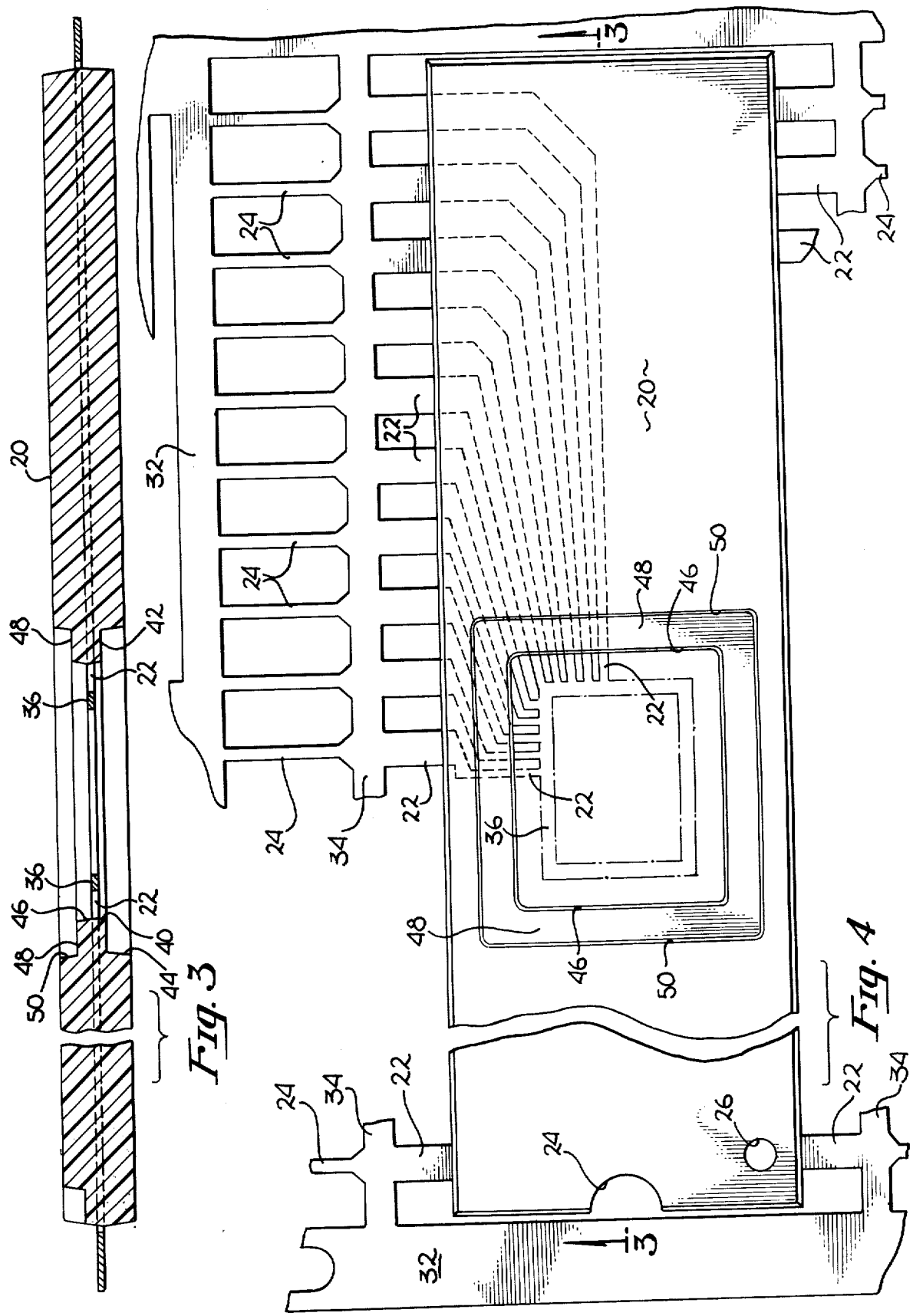

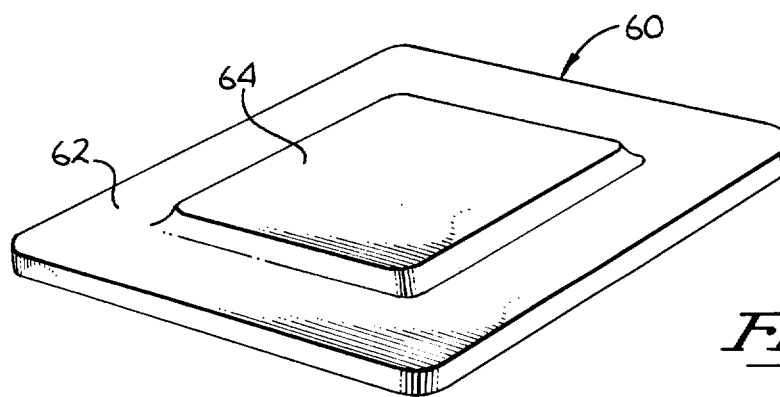
_Fig. 5_
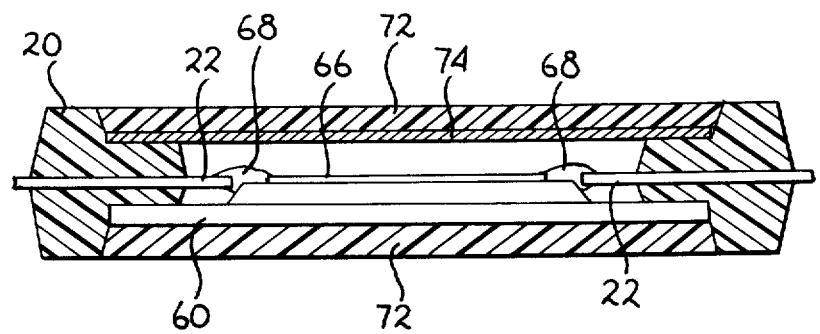
_Fig. 6_
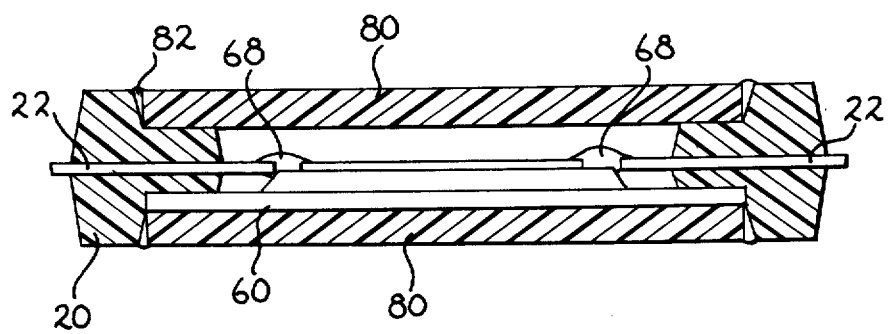
_Fig. 7_

SEMICONDUCTOR PACKAGE AND METHOD OF MANUFACTURE THEREOF

This is a continuation of application Ser. No. 392,347, filed Aug. 28, 1973, now abandoned.

BACKGROUND OF THE INVENTION

1. Field of the Invention

The present invention relates to the field of semiconductor devices, and more particularly to multiple lead plastic flat packs for integrated circuits and the like.

2. Prior Art

In recent years integrated circuits of increasing complexity have become commercially available in large quantities, with the cost of such circuits in the unpackaged chip form becoming lower and lower. While advances in technology have contributed to the increase in complexity and the decrease in cost of such devices, the cost is also affected by the fact that many such integrated circuits are fabricated simultaneously on a single semiconductor wafer, and may be tested on the wafer prior to the dicing of the wafer into individual integrated circuits. Thus, a single series of processing steps on a single semiconductor wafer results in the production of many integrated circuits simultaneously. Testing of the circuit prior to dicing generally allows the testing of many devices by a single asignment of the semiconductor wafer.

Packaging of semiconductor devices involves the handling and processing of individual integrated circuits after dicing. Thus, each circuit must be handled individually, each must be accurately located with respect to the package, each of the required contacts or connections between the chip and the package leads must be made, and the package must be satisfactorily sealed against moisture and other contaminants. Accordingly, it is not unusual for the cost of such packages to be on the order of the cost of the semiconductor device to be packaged therein, and in many cases it is even greater than the device to be packaged.

Because of the great emphasis and importance of cost of such packages, packages of the type commonly referred to as plastic flat packs have come into widespread use, particularly in commercial applications. Such packages are characterized by a generally rectangular, relatively thin plastic body with a plurality of leads projecting out of each side and then bent downward so that the device may be either plugged into a cooperatively disposed socket for such a device, or soldered directly to a printed circuit board adapted to receive the device. The plastic packages of the prior art generally dispose the top surface of the semiconductor chip below the plane of the top surface of the spider conductors, so that both the semiconductor surface and the lead frame surface cannot be maintained in focus under a microscope at the same time, and coupling wires are longer than necessary. In addition, fabrication and assembly are more difficult and time consuming than necessary, so that improvements in such packages and packaging techniques may be of substantial advantage to the end product cost and the packaged integrated circuit device reliability. Such an improvement should tend to eliminate one major cause of reliability problems which is due to epoxy materials coming in contact with the semiconductor (hot intermittent open).

BRIEF SUMMARY OF THE INVENTION

An improved semiconductor package and method of manufacture thereof whereby a metal lead frame is first formed. This lead frame is an alloy of copper although Kovar or other alloys or metals could be used. Copper has the advantage of good heat conduction and a favorable coefficient of expansion with respect to the plastic used, so a compression seal is formed around the leads, thereby providing an excellent hermitic seal. A case having a through opening for receipt of the semiconductor device and support therefor is transfer molded around the frame. An inner stabilizing member in the form of a ring connects all lead frame conductors providing planarity and strength to them. The ring serves not only to hold the conductors (terminals) in place, but acts as a dam to prevent flash during molding. The ring is then punched out so as to separate the inner portions of the lead frame conductors. The semiconductor device is accurately located with respect to one corner of a stepped base and cemented thereto. This assembly is then located with respect to the transfer molded package and cemented thereto to dispose the top surface of the semiconductor device approximately coplanar with the top surface of the spider conductors. Connection of the conductor pads on the semiconductor device to the spider conductors is then made in a conventional manner. The bottom opening of the package is then sealed and the top may be sealed with or without a barrier to prevent the potting of the semiconductor device itself, or plastic inserts may be cemented into the package to close off the semiconductor region. The resultant package allows for a cavity in which the die can be mounted, wire bonded and sealed.

BRIEF DESCRIPTION OF THE DRAWINGS

FIG. 3 is a cross-section of the plastic package after molding of the basic package around the spider of FIG. 2.

FIG. 4 is a top view of the package of FIG. 3 after the inner-support member 36 for the spider has been sheared off.

FIG. 5 is a perspective view of the stepped support member used in the package of the present invention.

FIG. 6 is a cross-sectional view of the preferred embodiment of the package of FIG. 1 taken along lines 6—6 of that figure.

FIG. 7 is a cross-sectional view of an alternate embodiment similar to the cross-section of FIG. 6.

DETAILED DESCRIPTION OF THE INVENTION

Figure 1:
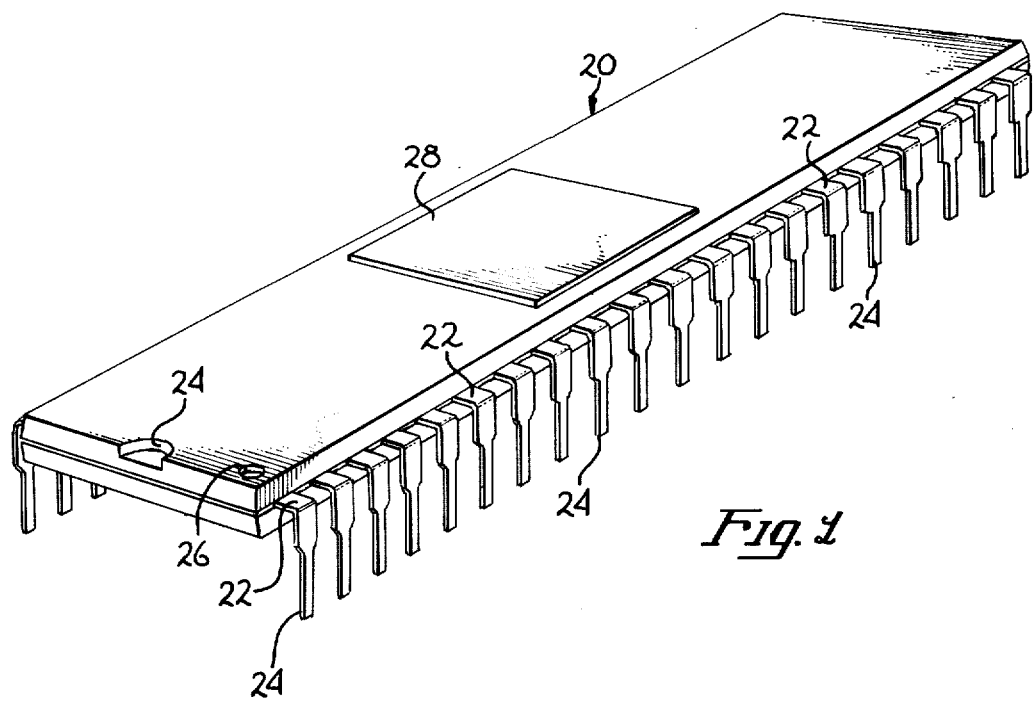
FIG. 1 is a perspective view of a typical flat pack package which may be fabricated in accordance with the present invention.

First referring to FIG. 1, a perspective view of a typical integrated circuit package which may be fabricated in accordance with the present invention may be seen. (The present invention, while being described herein with respect to the packaging of integrated circuits, is generally useful in the packaging of other electronic devices, such as, by way of example, resistor networks on a ceramic substrate.) The package is characterized by a relatively thin, generally rectangular plastic section 20 having a plurality of leads 22 projecting outward on each side of the rectangular section, generally midway through the thickness of the body, and each bent downward and having integral therewith a smaller pin-like member 24. The leads, together with the integral pin-like members, shall hereafter be referred to generally as leads or pins, as the general outline for the leads projecting from the plastic flat pack has been generally standardized and is well known in the prior art. At one end of the flat pack is a generally semi-circular centrally disposed reference mark 24 and a circular or cylindrical depression 26, both marks being for reference purposes. Generally disposed centrally to the top surface (as well as the bottom surface though not visible in the figure) is a rectangular area 28 within which the semi-conductor device is packaged. With respect to the visible details illustrated in FIG. 1, the general outline, i.e., leads, etc. are generally in accordance with standard packaging well known in the prior art.

Figure 2:
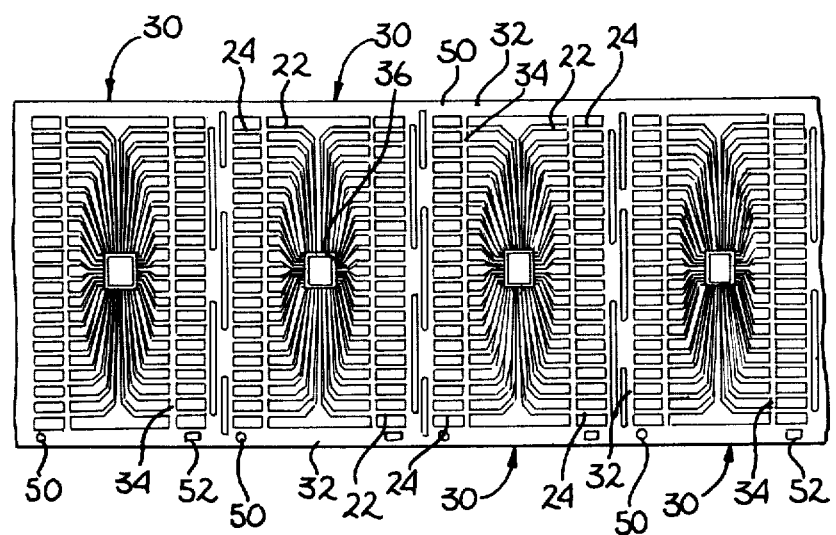
FIG. 2 is an illustration of the form of spider which may be used with the package of FIG. 1.

Now referring to FIG. 2, one of the component parts which is used to fabricate the package of the present invention may be seen. In this Figure is illustrated the manner in which a plurality of spider plates 30 are fabricated, either by punching or by etching techniques. Each of the spider plates 30 is characterized by an outlined structure such as outline 32 integral with the outermost portions of what will become pins 24, which in turn are connected to each other and to the outer structure 32 by integral members 34. Inward of members 34 are the leads 22 parallel to each other to within the outline of plastic package of FIG. 1, and then directed generally inwardly to be connected by a small support member 36, which holds the leads in position during lead frame fabrication and molding.

The next step in the fabrication of the package of the present invention may be seen in FIG. 3, (FIG. 4 illustrating a further step in the fabrication also illustrates some of the details to be described with reference to FIG. 3). In this step, the body of the plastic package 20 is transfer molded onto the spider 30, with the mold dies engaging the top and bottom surfaces of rectangular support member 36 and the inner portion of the leads 22 so as to define a cavity in the body 20 in that region and to maintain the surface of member 36 and the leads 22 free of transfer moldng material, though transfer molding material does flow between the leads to fill the spaces therebetween. In addition to the inward projecting rectangular section containing member 36 and a portion of the leads 22, the cavity is characterized by a short downward projecting portion 40 terminating in a face 42, with walls 44 defining the opening to the face 42. In the upper portion of the plastic body 20 are similar surfaces and areas 46, 48 and 50, with the surface 48 being located generally higher above the top plane of the contacts 22 than the surface 42 is below the lower plane of the contacts. The spiders 30 are provided with reference holes 50 and slots 52 for locating on locating pins within the mold cavity of the injection molding machine so that the location of the spider, and particularly the inner portion of the leads with respect to the molded plastic package cavity is accurately controlled.

Now referring to FIG. 5 a perspective view of the semiconductor support member 60 may be seen. The support member is characterized by a first rectangular region 62 and a raised or stepped central region 64 on which the semiconductor device is subsequently mounted. In the preferred embodiment this member is fabricated of Kovar, with the height of region 64 above member 62 being selected, as shall subsequently be more fully described, so as to dispose the top surface of the semiconductor device to be mounted thereon approximately level with the top surface of the adjacent leads in the injection molded plastic package. (Obviously, the top surface of this device can be disposed above or below the surface of the leads as desired, the controllability in this level being a key feature of the invention.)

Having now described the principal component parts of the present invention, the manner of assembly of the package will now be described. After injection molding of the package as shown in FIG. 3, the package is placed in a punch and die assembly and the support member (ring) 36 is sheared off, thereby separating each of the individual leads so that each lead may comprise a separate circuit lead for the integrated circuit to be mounted centrally with respect thereto. (Also, in this operation support members 34 are sheared away to separate the leads extended to the package outline, and subsequently the leads are bent downward to their final position as shown in FIG. 1.) The integrated circuit itself is located with respect to two sides of the member 60 (FIG. 5) and is cemented in the desired location on the surface of central area 64. Thereafter member 60, with the semi-conductor device 66 cemented thereto, is cemented into the plastic package 20 (See FIG. 6) in the proper orientation and locating with respect to two sides of member 60 so as to locate the semi-conductor device with respect to the leads cooperatively disposed in the package. In this sub-assembly the top surface of the semiconductor device 66 is substantially co-planar with the top surface of the leads 22 so that the interconnecting wires 68 may be relatively short and are generally horizontal in disposition, thus providing increased resistance to breakage and failure which otherwise might be caused by their length and/or the bending required to traverse two different elevations between their ends. The generally co-planar relationship between the top of the semi-conductor device 66 and the leads 22 further has the advantage that the operation, when viewed under a microscope, may be viewed with both the leads and the pads on the semiconductor device in focus simultaneously so as to reduce the amount of effort required in the interconnection and to aid in the inspection and quality assurance, both during the interconnection and after completion of the operation. In comparison, prior art packages resulted in the mounting of the semiconductor device onto a flat surface which generally disposed the top surface of the semiconductor device substantially above or below the plane of the leads, thereby interfering with simultaneous focusing of the leads and top surface of the semiconductor device and resulting in longer and more highly bent interconnecting wires connecting the semiconductor pads to the lead.

The assembly of FIG. 6 may be completed a number of ways. The remaining lower cavity beneath the mounting plate 60 may be potted with an epoxy resin 72. Substantially, any suitable potting resin may be used, though adhesion to the plastic material of the case 20 and resistance to environmental effects such as moisture are the desired qualities of the resin. Similarly the top cavity may also be potted with the resin 72, though this upper region should be separated from the cavity containing the semiconductor device by a plate such as the metal plate 74 so that the semiconductor device is not subjected to pressures and distortions resulting from the differential expansion between the epoxy and the semiconductor device.

As an alternate to the foregoing, a separate plastic cap 80 having substantially the same thickness as the cavity in which it mounts may be cemented around its edges 82 to the plastic package 20 to close off and seal the top portion of the package. For that matter, a similar plastic cap may be used on the bottom of the package. However, potting the base and top of the plastic package, preferably with a thixotropic resin, is preferred as it eliminates the separate plastic lids, has been found to reduce assembly time on the order of one-half minute per package, eliminates the use of clamps or other hold-devices to hold the plastic lids in place, and improves the hermetic seal and strength of the package as a result of the larger effective bond area. It further has been found to improve the cosmetic appearance of the package, and the package can be easily used in automatic handling equipment.

Thus, there has been described herein a plastic package for semiconductor devices and the like having improved reliability in such areas as physical integrity, hermetic seals and resistance to bonded wire breakage. The package also substantially reduces assembly time by improving wire bonding speeds and reducing the time required to seal the package. Die bonding can be done conventionally to the Kovar base (member 60) so the plastic package is not subjected to temperatures exceeding 150C. No plastic need come in contact with either the wire bonds or the mounted semiconductor device. Yield and reliability are increased as a result of less likelihood for inadvertent wire breakage, whether through operator error or because of the wire length, both because of the shorter wire runs and the generally co-planar relationship between the leads and the pads on the semiconductor device which maintain both wire contact points in focus simultaneously for the operator. These advantages may be obtained with varying size semiconductors or other devices, and in particular, with larger devices in any given package cavity as the altitude of the top surface of the semiconductor device can be adjusted to the desired level with the terminals by changing the support member for the device and therefore no space must be separately provided for the wire bond tool. While the support member having the raised central section as shown in FIG. 5 is more expensive than an equivalent flat plate mounting device, the raised support may be quickly and inexpensively manufactured by a stamping process so that this increase in cost over a flat plate is negligible, and particularly insignificant compared to the advantages resulting therefrom.

While the preferred embodiment of the present invention has been described in detail herein, it will be obvious to those skilled in the art that various changes in form and detail may be made therein without departing from the spirit and scope of the invention.

We claim:

1. An electronic device package to provide coupling between a plurality of external terminals and internal terminals within said package comprising:

a molded package body defining an opening extending through said package body through an upper and lower surface of said package body, said package body having a receiving surface formed adjacent to the perimeter of said opening;

a plurality of leads disposed in a common plane within said package body, said plurality of leads extending through said package body into said opening, said plurality of leads having a central member interconnecting each of said plurality of leads at an end of each lead terminating within said opening, said plurality of leads being disposed within said package body, with said central member intact, said central member being removable to allow said plurality of leads to be electrically separated after said plurality of leads are permanently fixed within said package body, said separated plurality of leads forming said internal terminals at the end of said leads terminating within said opening and forming said external terminals at the end of said leads terminating outside said package body;

a device mounting member having a pheripherial surface engaging said receiving surface of said package body, and having a generally flat platform surface disposed within said opening by a preselected displacement;

an electronic device having a lower surface affixed to said platform surface, and an upper surface of said electronic device being disposed within said opening so as to lie in a substantially common plane with an upper surface of each lead of said plurality of leads;

means for coupling said electronic device to said plurality of leads; and means for sealing said opening in said package body.

2. The package of claim 1 wherein said package body is a plastic body and said means for sealing said opening comprises a plastic cap cemented to said package body over said opening.

3. The package of claim 1 wherein said package body, said opening defined therein, and said device mounting member are substantially rectangular in plan form.

4. The package of claim 1 wherein said means for sealing said opening comprises epoxy disposed below said device mounting member and epoxy disposed above a plate covering said opening.

5. A lead frame for use in packaging electronic devices comprising a plurality of leads formed from a sheet of metal, said plurality of leads projecting inward toward a central member, each of said leads being integrally coupled to said central member and said central member being removable from said plurality of leads after said lead frame is permanently disposed into a package body.

6. A method of fabricating a package for use in packaging an electronic device comprising the steps of:

molding a package body around a plurality of leads, said plurality of leads generally radiating from a central member and lying in a common plane, said package body being formed to define an opening extending from an upper surface to a lower surface of said package body, a portion of each lead of said plurality of leads and said central member lying at least in part within said opening defined within said package body; and removing said central member to electrically separate said plurality of leads.

7. The method of claim 6 wherein said central member is removed by punching.

8. The method of claim 6 further comprising the steps of:

affixing an electronic device to a platform surface of a device mounting member;

affixing said device mounting member to said package body so that said platform surface is disposed within said opening defined in said package body and so that an upper surface of said electronic device lies in a substantially common plane with an upper surface of each lead of said plurality of leads extending within said opening;

selectively coupling said electronic device to said leads; and sealing said opening above said electronic device and below said device mounting member.

9. The method of claim 8 wherein the step of sealing said opening comprises the steps of:

providing a sealing member above said electronic device to prevent epoxy from contacting said electronic device; and potting said opening with epoxy resin above said sealing member and below said device mounting member.

10. The package of claim 2 wherein said means for sealing said opening comprises molded plastic caps cemented to said package body below said device mounting member and cemented to said package body above said electronic device.

11. The method of claim 8 wherein the step of sealing said opening comprises the steps of cementing a plastic cap with epoxy resin to said package body above said electronic device and cementing a plastic cap with epoxy resin to said package body below said device mounting member.

12. A method of packaging an electronic device comprising the steps of:

molding a generally rectangular plastic package around a plurality of leads, said plurality of leads generally radiating from a central member and lying in a common plane, said package body being molded to define an opening extending from an upper surface to a lower surface of said package body, a portion of each of said plurality of leads and said central member lying at least in part within said opening defined within said package body, said package body having a receiving surface formed adjacent to the periphery of said opening on said lower surface of said package body;

removing said central member of said plurality of leads to electrically separate said plurality of leads;

affixing an electronic device to a central surface of a device mounting member, said device mounting member being configured to engage said receiving surface of said package body;

affixing said device mounting member to said package body so that said device mounting member engages said receiving surface of said package body, so that said central surface of said device mounting member is disposed within said opening defined within said package body, and so that an upper surface of said electronic device lies in a substantially common plane with an upper surface of each lead of said plurality of leads extending within said opening;

selectively coupling said electronic device to said plurality of leads; and sealing said opening above said electronic device and below said device mounting member.

13. The method of claim 12 wherein the step of sealing said opening comprises cementing a plastic cap to said package body over said opening at said upper and lower surfaces of said packaged body.

* * * * *